(12) United States Patent
Mori et al.

(10) Patent No.: US 6,521,925 B1
(45) Date of Patent: Feb. 18, 2003

(54) SOLID-STATE IMAGE SENSOR

(75) Inventors: Akiko Mori; Hisanori Ihara; Tetsuya Yamaguchi, all of Yokohama; Hiroaki Ishiwata, Kawasaki; Hidetoshi Nozaki, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/537,745

(22) Filed: Mar. 30, 2000

(30) Foreign Application Priority Data

Mar. 31, 1999 (JP) .......................................... 11-091726

(51) Int. Cl.[7] .......................................... H01L 31/062
(52) U.S. Cl. .......................................... 257/292; 438/48
(58) Field of Search ............................ 357/30; 257/292, 257/191, 445, 290, 59, 72, 234, 291; 438/57, 48

(56) References Cited

U.S. PATENT DOCUMENTS

| | | | | |
|---|---|---|---|---|
| 4,984,047 A | * | 1/1991 | Stevens | 357/30 |
| 5,625,210 A | * | 4/1997 | Lee et al. | 257/292 |
| 5,903,021 A | * | 5/1999 | Lee et al. | 257/292 |
| 6,084,259 A | * | 7/2000 | Kwon et al. | 257/292 |
| 6,150,676 A | * | 11/2000 | Sasaki | 257/191 |
| 6,169,318 B1 | * | 1/2001 | McGrath | 257/445 |
| 6,184,055 B1 | * | 2/2001 | Yang et al. | 438/57 |
| 6,218,691 B1 | * | 4/2001 | Chung et al. | 257/290 |

FOREIGN PATENT DOCUMENTS

| | | |
|---|---|---|
| JP | 62-55960 | 3/1987 |
| JP | 11-274457 | 10/1999 |

OTHER PUBLICATIONS

Copy of Official Filing Receipt for and U.S. Application No. 09/272,337 for "SOLID–STATE IMAGE PICKUP APPARATUS" by Nobuo Nakamura, filed Mar. 19, 1999.

* cited by examiner

*Primary Examiner*—Son L. Mai
*Assistant Examiner*—Dao H. Nguyen
(74) *Attorney, Agent, or Firm*—Finnegan, Henderson, Farabow, Garrett & Dunner, L.L.P.

(57) ABSTRACT

A solid-state image sensor comprises a photodiode which is provided in a p-type substrate or a p-type well and composed of a first n-type region for storing photoelectrically converted signal charges, a gate electrode provided above the substrate or well so as to be adjacent to one end of the photodiode, and a n-type drain provided at the surface of the substrate or well opposite to the photodiode, with the gate electrode interviewing therebetween. There is provided a second n-type region which is formed so as to be in contact with the upper part of the first n-type region on the gate electrode side and one end of which is formed to self-align with one end of the gate electrode to be part of the photodiode. This construction prevents the short-channel effect of the signal read transistor section and reduces or eradicates the left-over signal charges stored in the photodiode, thereby reducing noise and improving the sensitivity of the sensor.

20 Claims, 9 Drawing Sheets

SOLID-STATE IMAGE SENSOR

CROSS-REFERENCE TO RELATED APPLICATIONS

This application is based upon and claims the benefit of priority from the prior Japanese Patent Application No. 11-091726, filed Mar. 31, 1999, the entire contents of which are incorporated herein by reference.

BACKGROUND OF THE INVENTION

This invention relates to a solid-state image sensor, and more particularly to a solid-state image sensor with an improved read transistor portion for reading signal charges from a photoelectric conversion section, such as a photodiode.

In the field of solid-state image sensors, various techniques for amplifying MOS image sensors with an amplifying function in their pixels have been proposed. MOS image sensors of this type have been expected to be suitable for the reduction of the pixel size following an increase in the number of pixels or a reduction in the chip size. In addition, the MOS image sensors have the advantages that they consume less electric power and make it easier to integrate the sensor section with its peripheral circuit by the same CMOS process than CCD image sensors.

A MOS image sensor is composed of unit cells, each unit cell constituting one pixel, arranged two-dimensionally. A unit cell is composed of a photoelectric conversion element and a transistor. The signal charges generated by photoelectric conversion at the photoelectric conversion element modulate the potential at a signal storage section (a photodiode acting as a photoelectric conversion element generally also serves as a signal storage section). The amplifying transistor in a pixel is modulated according to the potential, thereby providing the inside of the pixel with an amplifying function.

One of the most important evaluation items concerning this type of device is a brightly shining (or a whitely shining monochrome) point (white defect) caused by an extremely high output among the pixels activated during a dark period. One of the causes of a white defect is leakage current from the photoelectric conversion section. To decrease the leakage current, it is necessary to keep a photodiode (PD) acting as a photoelectric conversion element away from the surface of the semiconductor substrate where many causes of leakage current exist. That is, it is necessary to form a PD in a place deep down from the substrate surface.

With a PD formed in a place deep down in the substrate, however, even when a maximum voltage of 3.3V applied to a device using CMOS transistors is applied to a read gate electrode, the potential below the gate does not rise sufficiently because there is a limit to the extent of the depletion layer. As a result, the electric charges have been read partially or not been read at all. The left-over charges or the processing thereof permit another noise to occur in the activated pixels.

To overcome the problem, a method of providing a second signal storage section under the gate electrode in the semiconductor substrate has been proposed (refer to Jpn. Pat. Appln. KOKAI Publication No. 11-274457). Use of the second signal storage section makes the effective gate length shorter and therefore can involve a short-channel effect.

Conventional CCD image sensors employ n-type substrates, whereas MOS image sensors use p/p$^+$ substrates obtained by growing an epitaxial layer at a low B concentration of, for example, 1×10$^{14}$ cm$^{-3}$ to a thickness of about 5 to 10 μm on the surface of the substrate with a very high B concentration of, for example, 1 to 3×10$^{18}$ cm$^{-3}$. The reason why conventional CCD image sensors employ n-type substrates is to prevent blooming and color cross talks from taking place by allowing those of the carriers generated by photoelectric conversion not gathered in the PD, particularly those generated deep in the substrate or those leaking from the PD due to strong incident light to be easily discarded to the substrate side, although they tend to leak into adjacent pixels by diffusion. Discarding carriers generated by photoelectric conversion, however, leads to a decrease in the sensitivity.

To solve the sensitivity decrease problem, CCD image sensors use a method of applying a higher read voltage (e.g., 5V) to widen the depletion layer and gathering carriers from a wider region. MOS image sensors are characterized by operating on a lower voltage than CCD image sensors. Because of the lower voltage driving, the depletion layer under the gate electrode does not get wider than that in CCD image sensors. Therefore, an improvement in the sensitivity by this method cannot be expected in MOS image sensors.

Figure 1:
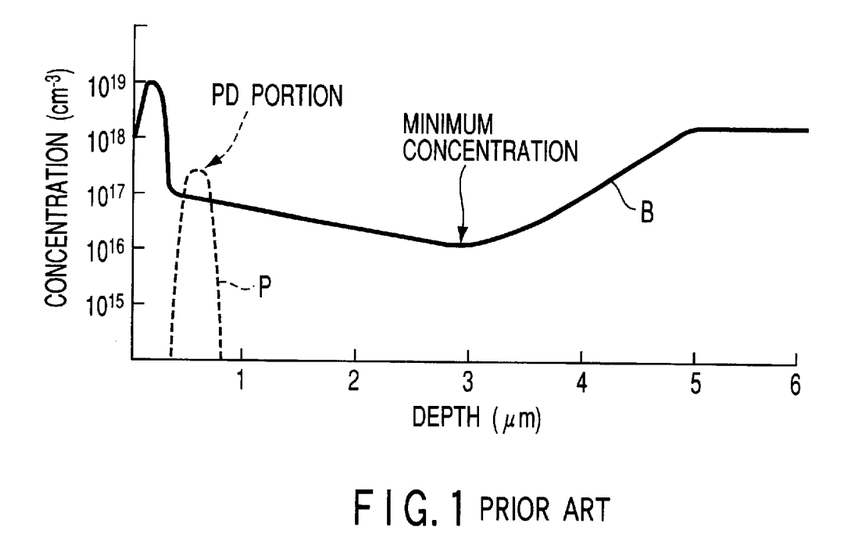
FIG. 1 shows an impurity concentration distribution in the PD in a conventional image sensor.
Figure 2:
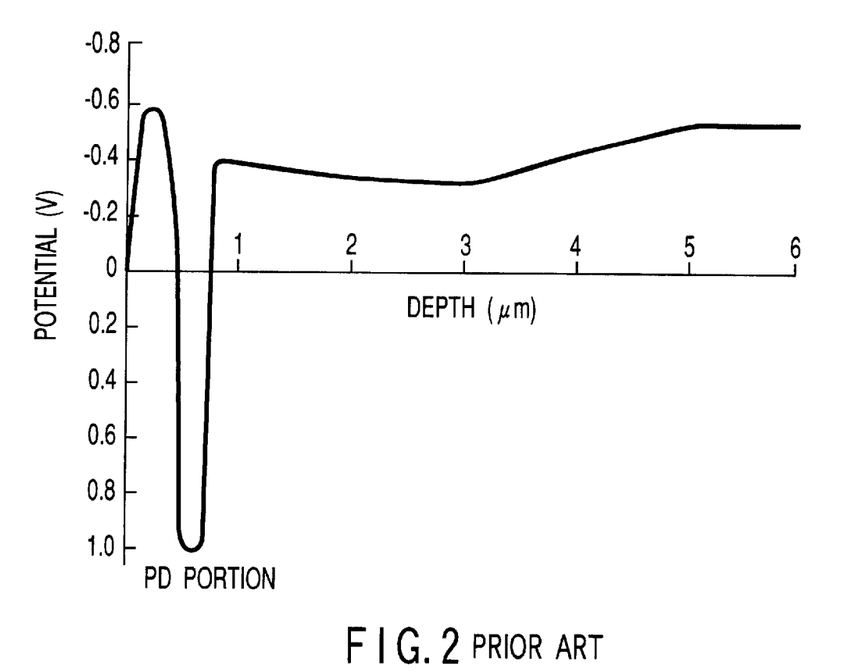
FIG. 2 shows a potential distribution in the PD in the conventional image sensor.

With this backdrop, MOS image sensors employ the aforementioned p/p$^+$ substrate and gather generated carriers in the PD to increase the sensitivity without discarding them to the substrate side. FIG. 1 shows an impurity concentration distribution in the direction of depth in the PD of a MOS image sensor. FIG. 2 shows a potential distribution in the direction of depth. As shown in FIG. 1, such a profile as has the lowest B concentration at a specific depth (about 3 μm) of the substrate is used. Use of the profile enables carries generated at a place deeper than the PD portion to bounce back toward the surface of the substrate by a low potential at a position deeper than the place with the lowest B concentration, even when the carriers attempt to diffuse more deeply. As a result, because part of the electrons rebounded gather in the PD by diffusion or the like, an improvement in the sensitivity can be expected as compared with an equivalent formed on an ordinary p-type Si substrate. Moreover, by increasing the concentration on the substrate side and shortening the lifetime of carriers, carriers generated at still deeper places can be prevented from leaking into adjacent pixels by diffusion.

In the impurity profile of the PD in an amplifying solid-state image sensor using a p/p$^+$ substrate, the B concentration is high even at the surface of the substrate to provide a surface shield layer or the like and the B concentration is the lowest at a depth deeper than the depth at which the P (phosphorus) concentration of the PD peaks. Specifically, in this profile, even if electrons generated in the vicinity of the photodiode tend to flow toward a deeper place in the substrate, they are caused to bounce back to the surface side of the substrate at the aforesaid high B concentration place and diffuse sidewise in the substrate at the minimum point of B concentration. The flow of electrons is the cause of color cross talks. In any case, the diffusion of electrons rebounded at the high B concentration place might improve the sensitivity or cause color cross talks. Thus, the technical problem of MOS image sensors is to realize a PD structure capable of gathering carriers in the PD more efficiently.

In addition, MOS image sensors also have a noise feedback problem. At the impurity concentration in a conventional PD, even when the PD was operated on 3.3V, the signal charge stored in the PD could not be read out completely. Because of this, the capacitance C at the PD portion caused kTC noise. If noise charge is Q, the square mean of the noise charge is expressed as:

$$Q^2=kTC.$$

As described above, in a MOS image sensor, the photoelectric conversion section must be kept away from the surface of the semiconductor substrate where many causes of leak current exist, that is, the photoelectric conversion section must be formed at a deep place from the substrate surface. In this case, low voltage driving at about 3.3V puts a limit on the extent of the depletion layer, which permits some of the signal charges to be left over or completely prevents the signal charges from being read.

In addition, although providing a second signal storage section under the gate has been proposed, this method might cause a short-channel effect.

In a MOS image sensor formed on a p/p⁺ substrate, use of low-voltage driving prevents the depletion layer from getting wider in the PD. As a result, an improvement in the sensitivity cannot be expected using a similar means to that in a CCD image sensor. In addition, the problem of carriers leaking into adjacent PDs (color cross talks) or a blooming problem arises. Furthermore, in conventional MOS image sensors, noise has occurred in the PD portion, leading to a poor picture quality.

BRIEF SUMMARY OF THE INVENTION

An object of the present invention is to provide a solid-state image sensor which not only prevents a short-channel effect in the transistor section for reading the signal charges stored in the photoelectric conversion section but also reduces or eradicates the left-over signal charges, thereby reducing noise and improving the sensitivity.

Another object of the present invention is to provide a solid-state image sensor which not only improves the sensitivity even when being formed on a p/p⁺ substrate but also reduces carriers leaking into adjacent PDs (or color cross talk) and alleviating blooming.

Still another object of the present invention is to provide a solid-state image sensor which eliminates kTC noise caused by an effective capacitance at the PD portion and improves the picture quality.

To accomplish the foregoing objects, a solid-state image sensor according to a first aspect of the present invention comprises: a first-conductivity-type semiconductor layer with a surface; a second-conductivity-type first region provided in the semiconductor layer, constituting a photoelectric conversion section together with the semiconductor layer to store photoelectrically converted signal charges, and having a first end and a second end opposite to each other in one direction along the surface of the semiconductor layer; a gate electrode insulatively provided above the surface of the semiconductor layer so as to be adjacent to the second end of the first region, having a first end and a second end opposite to each other in the one direction along the surface of the base layer, the first end of the gate electrode being adjacent to the second end of the first region, and positioned on the surface of the semiconductor layer in a part other than that above the first region; a second-conductivity-type second region provided on an upper part of the first region on the second end side so as to be in contact with the first region, having a first end and a second end opposite to each other in the one direction along the surface of the semiconductor layer, and the second end of the second region being substantially aligned with the first end of the gate electrode in a direction perpendicular to the surface of the semiconductor layer; and a second-conductivity-type third region adjacent to the second end of the gate electrode, provided on the surface of the semiconductor layer opposite to the first region, and serving as a drain region.

It is desirable that the second end of the first region is displaced from the second end of the second region toward the first end of the second region.

It is desirable that there is provided a first-conductivity-type fourth region provided on the surface of the semiconductor layer above the first region and serving as a surface shield region whose impurity concentration is higher than that in the semiconductor layer.

It is desirable that there is further provided a first-conductivity-type fifth region provided under the third region and serving as a punch through stopper whose impurity concentration is higher than that in the semiconductor layer.

It is desirable that a depth at which the second-conductivity-type impurity concentration is the highest throughout the first region and the second region is 0.65 μm or less below the surface of the semiconductor layer.

It is desirable that the semiconductor layer is a semiconductor substrate.

It is desirable that the semiconductor layer is a well provided at the surface of the semiconductor substrate.

It is desirable that the semiconductor layer is an epitaxial layer formed on a semiconductor substrate whose impurity concentration is higher than that in the semiconductor layer.

According to a second aspect of the present invention, there is provided a solid-state image sensor comprising: a p-type semiconductor substrate having a surface; a p-type well provided on the surface of the semiconductor substrate, an impurity concentration of the p-type well being lower than a p-type impurity concentration in a place of the semiconductor substrate deeper than the p-type well; and an n-type region provided in the p-type well and, together with the p-type well, forming a photoelectric conversion section, wherein a depth at which an n-type impurity concentration in the n-type region is the highest is deeper than a depth at which a p-type impurity concentration in a depth direction of the substrate is the lowest throughout the p-type well and the substrate.

It is desirable that a p-type surface shield layer whose impurity concentration is higher than that in the p-type well is formed above the n-type region.

It is desirable that the depth at which the impurity concentration in the n-type region is the highest is 0.65 μm or less below the surface of the semiconductor substrate.

According to a third aspect of the present invention, there is provided a solid-state image sensor comprising: a semiconductor substrate of a first conductivity; and an imaging region formed on the semiconductor substrate and having unit cells arranged in a matrix, each of the unit cells including a photoelectric conversion section composed of a second conductivity-type region formed in the semiconductor substrate and a first conductivity-type region made up of the semiconductor substrate, and a signal scanning circuit, wherein an impurity concentration Na in the second conductivity-type region constituting the photoelectric conversion section is set so that a relationship with an impurity concentration Nb in the first conductivity-type region constituting the photoelectric conversion section satisfies a following expression:

$$0 < Na - Nb < 1 \times 10^{17} \text{ cm}^{-3}.$$

It is desirable that a first conductivity-type surface shield layer whose impurity concentration is higher than that in the p-type semiconductor substrate is formed above the second conductivity-type region.

It is desirable that a depth at which the impurity concentration in the second conductivity-type region is the highest is 0.65 μm or less below a surface of the semiconductor substrate.

It is desirable that each of the impurity concentration Na in the second conductivity-type region constituting the photoelectric conversion section and the impurity concentration Nb in the first conductivity-type region constituting the photoelectric conversion section is in a range of $1 \times 10^{14}$ cm$^{-3}$ to $1 \times 10^{18}$ cm$^{-3}$.

With the present invention, even when impurity ions are implanted deeply into the semiconductor substrate to reduce white defects, thereby forming the photoelectric conversion section, the signal charges stored in the photoelectric conversion section can be read sufficiently even at a voltage lower than a low power supply voltage of 3.3V or below used for the CMOS device by providing the second photoelectric conversion section in the upper part of the photoelectric conversion section on the gate electrode side. Specifically, the left-over signal charges stored in the photoelectric conversion section are reduced or eradicated, which reduces noise and improves the sensitivity.

Because the end of the second photoelectric conversion section on the gate side is formed so as to self-align with the closer end of the gate electrode, the short-channel effect of the signal read transistor is prevented.

Figure 3:
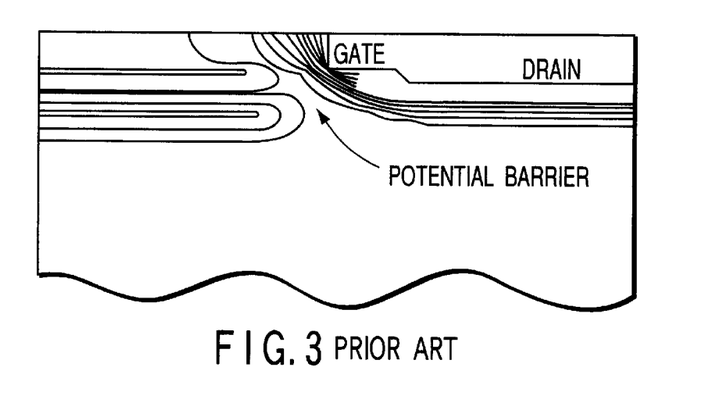
FIG. 3 shows a potential profile of a conventional solid-state image sensor without a second photoelectric conversion section.
Figure 4:
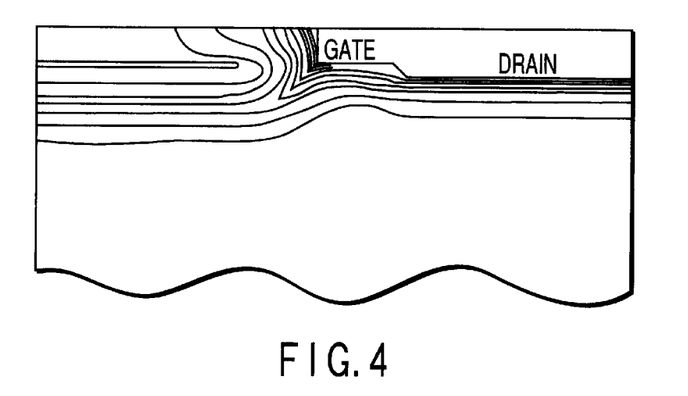
FIG. 4 shows a potential profile of a conventional solid-state image sensor of the present invention with a second photoelectric conversion section.

FIGS. 3 and 4 show potential profiles to help explain the result of comparing a case with a second photoelectric conversion section with a case without the same. When there is no second photoelectric conversion section in a photodiode formed in a similar manner, the presence of a potential barrier prevents charges from being read as shown in FIG. 3. In contrast, when there is a second photoelectric conversion section, a charge path without a potential barrier is formed as shown FIG. 4, enabling charges to be read.

In addition, with the present invention, the depth at which the n-type impurity concentration in the photoelectric conversion section is the highest is deeper than the substrate depth at which the boron concentration in the direction of substrate depth is the lowest. This prevents electrons generated near the photoelectric conversion section from flowing toward a deeper place in the substrate and therefore those electrons from being rebounded in a deeper place of the substrate and diffusing sidewise. Consequently, the sensitivity is improved, color cross talks are reduced, and further blooming is suppressed.

Furthermore, with the present invention, the relationship between an impurity concentration Na in the second conductivity-type region constituting the photoelectric conversion section and an impurity concentration Nb in the first conductivity-type region below the photoelectric conversion section is set so as to satisfy the following expression: $0 < Na - Nb < 1 \times 10^{17}$ cm$^{-3}$. This causes the photoelectric conversion section to turn into a depletion region, making the noise charge Q at the photoelectric conversion section substantially zero. As a result, noise generated in a conventional photoelectric conversion section is eliminated, improving the picture quality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

Figure 5:
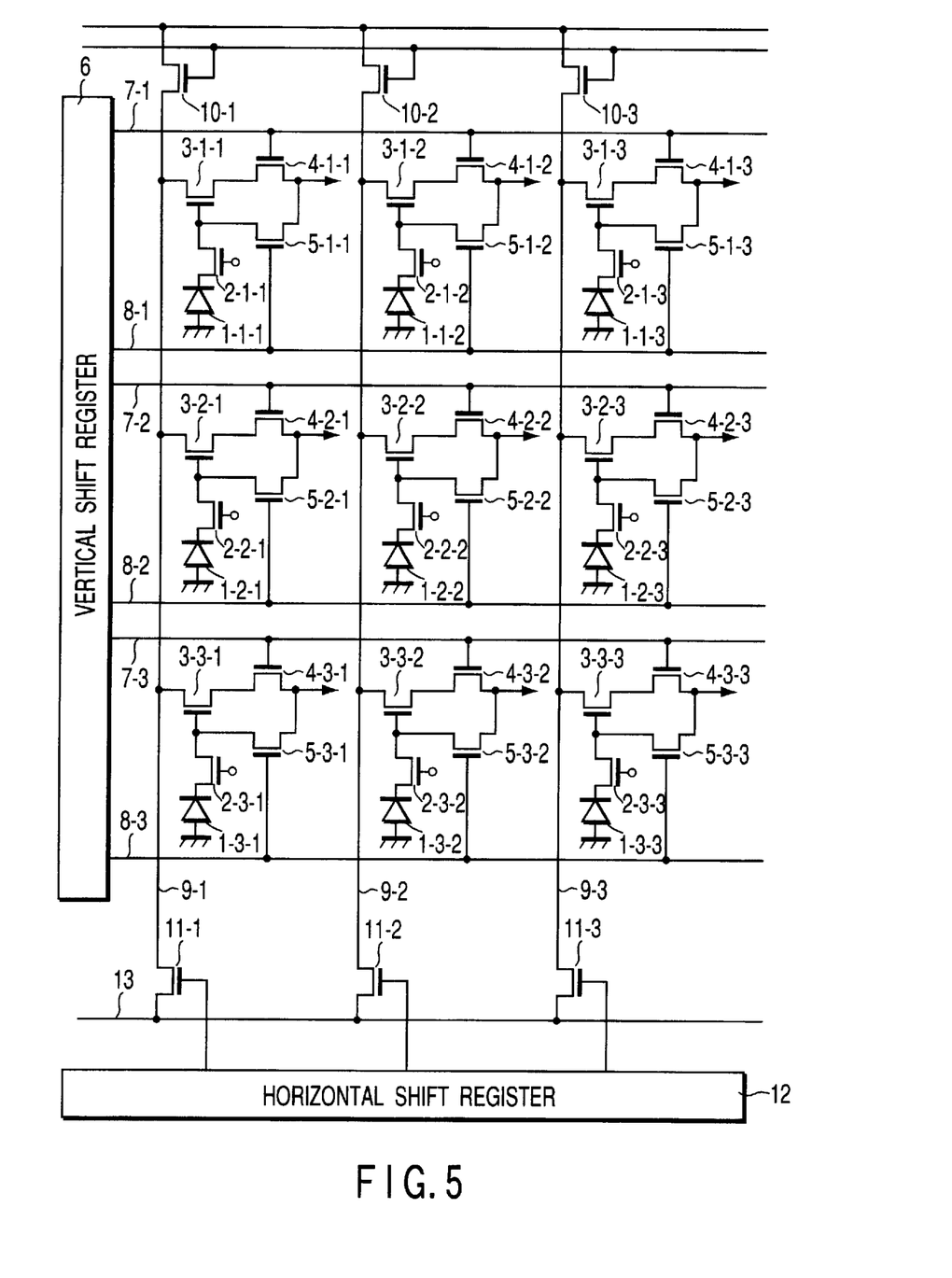
FIG. 5 is a circuit diagram showing the configuration of a MOS image sensor according to embodiments of the present invention.

FIG. 5 is a circuit diagram showing the configuration of a MOS image sensor according to a first embodiment of the present invention.

Unit cells are arranged in a 3×3 matrix two-dimensionally. Each unit cell is composed of a photodiode 1 for photoelectric conversion (1-1-1, 1-1-2, ..., 1-3-3), a read transistor 2 for reading the signal from the photodiode (2-1-1, 2-1-2, ..., 2-3-3), an amplifying transistor 3 for amplifying the read signal charge (3-1-1, 3-1-2, ..., 3-3-3), a vertical select transistor 4 for selecting a line onto which the signal is to be read (4-1-1, 4-1-2, ..., 4-3-3), and a reset transistor 5 for resetting the signal charge (5-1-1, 5-1-2, ..., 5-3-3). Actually, much more unit cells are arranged.

A horizontal address line 7 extending horizontally from a vertical shift register 6 (7-1, ..., 7-3) is connected to the gate of the vertical select transistor 4, thereby determining a line onto which the signal is read. A reset line 8 (8-1, ..., 8-3) is connected to the gate of the reset transistor 5. The source of the amplifying transistor 3 is connected to a vertical signal line 9 (9-1, ..., 9-3). One end of the vertical signal line 9 is provided with a load transistor 10 (10-1, ..., 10-3). The other end of the vertical signal line 9 is connected to a horizontal signal line 13 via a horizontal select transistor 11 (11-1, ..., 11-3) selected by a select pulse supplied from a horizontal shift register 12.

The MOS image sensor of the first embodiment has basically the same circuit configuration as that of a conventional equivalent except for the following element configuration.

Figure 6:
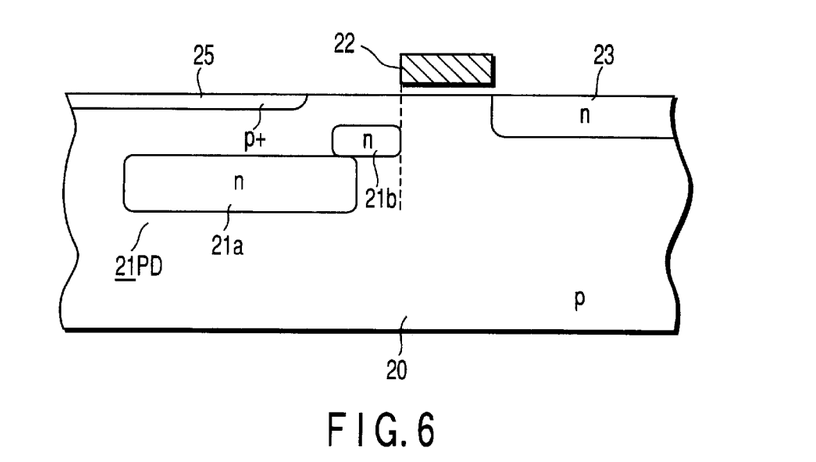
FIG. 6 is a sectional view showing the configuration of the photoelectric conversion section and signal read section of a pixel in the first embodiment.

FIG. 6 is a sectional view to help explain the structure of an element in the first embodiment. In the figure, the photoelectric conversion section and signal read section in one unit cell part (or one pixel) are shown.

As shown in FIG. 6, in the first embodiment, there are provided a p-type Si substrate or a p-well 20 and a photodiode (photoelectric conversion section) PD 21 composed of a first n-type diffused layer 21a which is provided in the substrate or well, converts light into charge, and stores the charge. A gate electrode 22 is provided above the p-type substrate or p-well 20 via a gate oxide film (not shown) in such a manner that the electrode adjoins one end of the first n-type diffused layer 21a. On the other side of the gate electrode 22 opposite to the PD 21, a drain region 23 composed of an n-type diffused layer is provided at the surface of the p-type substrate or p-well 20.

A second n-type diffused layer 21b is provided in the upper part of the PD 21 on the gate electrode 22 side in such a manner that the layer 21b is in contact with the first n-type diffused layer 21a on the substrate surface side and one end of the layer 21b is aligned with one end of the gate electrode 22 in the vertical direction to the surface of the p-type substrate or p-well 20. A surface shield layer 25 made of a $p^+$-type diffused layer is provided in the upper part of the PD 21 in the surface of the p-type substrate or p-well 20. The gate electrode 22, first n-type diffused layer 21a, second n-type diffused layer 21b, and n-type drain region 23 constitute a MOS transistor.

Figure 7A:
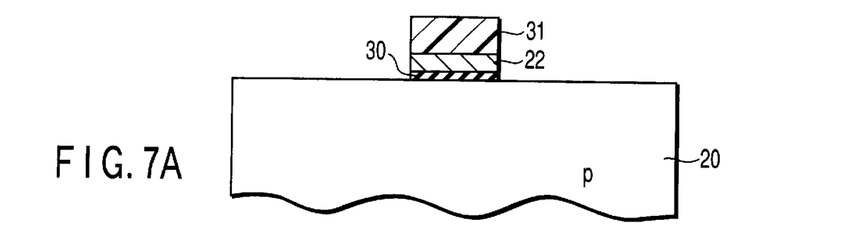
FIGS. 7A to 7E are sectional views to help explain stepwise the process of manufacturing a MOS image sensor in the first embodiment.

Referring to FIGS. 7A to 7E, simple manufacturing processes for the above-described MOS image sensor will be explained. As shown in FIG. 7A, after a gate oxide film has been formed on a p-type Si substrate or p-well 20 by thermal oxidation, polysilicon is deposited by, e.g., CVD techniques. Then, after a resist pattern 31 has been formed, the deposited polysilicon is processed into a desired shape, thereby forming a gate electrode 22 and a gate oxide film 30.

Figure 7B:
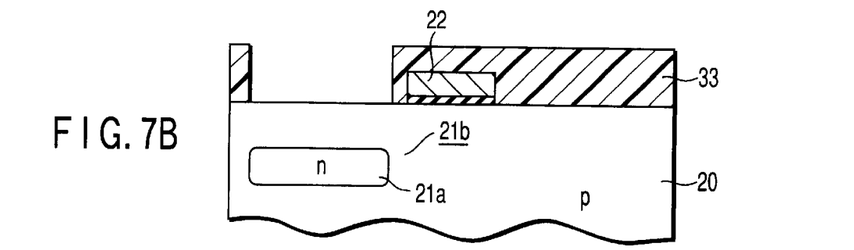

Next, as shown in FIG. 7B, after the resist pattern 31 has been removed and a new resist pattern 32 has been formed, the first n-type diffused layer 21a of the photoelectric conversion section PD 21 is formed deep in the substrate by high-energy ion implantation. At this time, the gate electrode 22 is covered completely with the resist 32 lest ions should pass through the gate electrode.

Figure 7C:
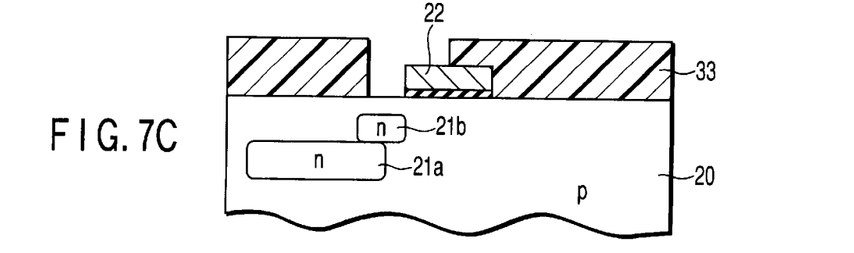

Then, as shown in FIG. 7C, the resist pattern 32 is removed and a new resist pattern 33 is so formed that it exposes one end of the gate electrode. Thereafter, by implanting ions through the opening of the resist 33, the second n-type diffused layer 21b of the photoelectric conversion PD 21 is formed in such a manner that it self-aligns with the gate electrode 22. At this time, ions are implanted at such an accelerated voltage as allows no ion to pass through the gate electrode. As a result, the second n-type diffused layer 21b is so formed that it is shallower than the first n-type diffused layer 21a and is in contact with the substrate surface side of the n-type diffused layer 21a.

Figure 7D:
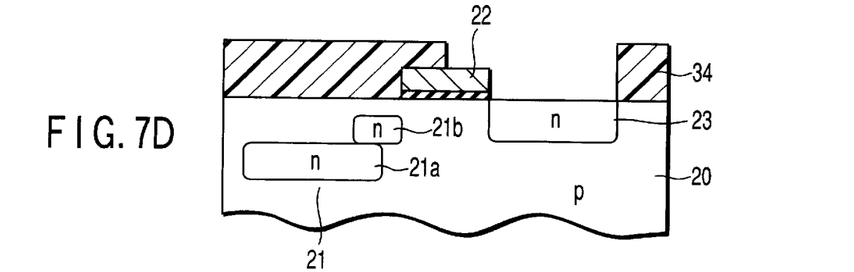

Then, as shown in FIG. 7D, after the resist pattern 33 has been removed and a new resist pattern 34 has been formed, the n-type diffused layer (drain region) 23 is formed by ion implantation in such a manner that it self-aligns with the gate electrode 22. In this case, the order in which the second n-type diffused layer 21b and drain region 23 are formed may be reversed.

Figure 7E:
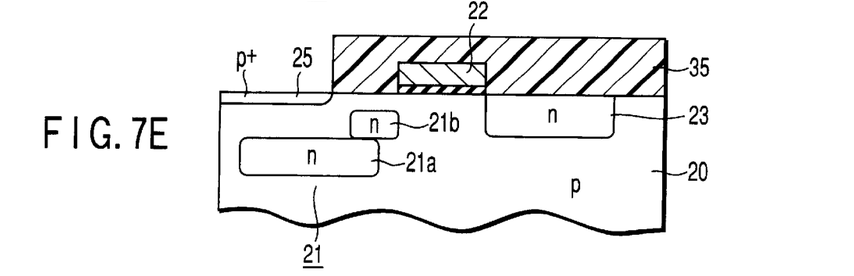

Finally, as shown in FIG. 7E, after the resist pattern 34 has been removed and a new resist pattern 35 has been formed, ions are implanted at a low acceleration voltage to form the $p^+$-type diffused layer (surface shield layer) 25 on the PD 21 side of the substrate with respect to the gate electrode 22.

Figure 8:
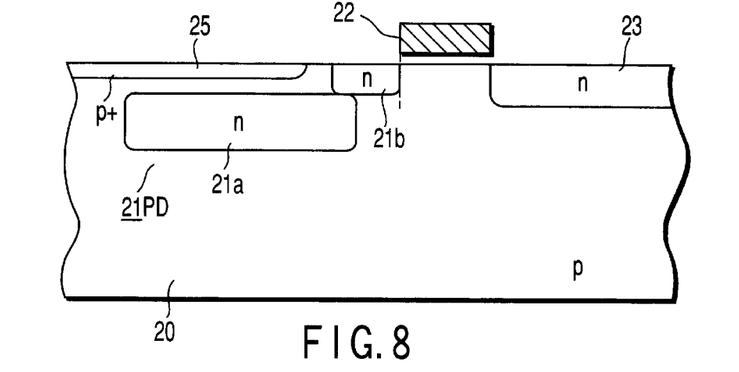
FIG. 8 is a sectional view showing the configuration of a modification of the first embodiment.

While in FIG. 6, the second n-type diffused layer 21b has been provided inside the p-type substrate or p-type well, it may be provided at the surface of the p-type substrate or p-type well as shown in FIG. 8. In the structure of FIG. 8, the impurity concentration in the p-type substrate or p-type well may be in the order of $(1 \text{ to } 10) \times 10^{17}$ $cm^{-3}$. However, when the second n-type diffused layer is provided inside the p-type substrate or p-type well, it is desirable that the impurity concentration in the p-type substrate or p-type well is lower than $1 \times 10^{17}$ $cm^{-3}$ from the viewpoint of reading charges from the PD 21.

More specifically, when the position at which the impurity concentration in the second n-type impurity layer 21b becomes the highest is 0.5 μm or less below the substrate surface, it is desirable that the impurity concentration in the p-type substrate or p-type well is $(1 \text{ to } 10) \times 10^{16}$ $cm^{-3}$. When the position is 0.5 to 0.65 μm below the substrate surface, it is desirable that the impurity concentration in the p-type substrate or p-type well is $(1 \text{ to } 10) \times 10^{15}$ $cm^{-3}$.

It is desirable that the impurity concentration in the second n-type diffused layer 21b is made a little higher than that in the first n-type diffused layer so that the potential curve from the potential at the first n-type diffused layer to the potential at the p-type substrate or p-type well just under the gate electrode 22 by the application of a voltage may rise gently via the potential of the second diffused layer.

The film thickness of the gate electrode 22 must be such that it can withstand the acceleration of ion implantation necessary to cause the second n-type diffused layer 21b to come into contact with the first n-type diffused layer 21a when the second n-type diffused layer 21b is formed by gate self-alignment.

In addition, it is necessary that the point at which the second n-type diffused layer 21b contacts the first n-type diffused layer 21a in the same type impurity diffused region and the impurity concentration becomes the highest throughout the two layers should be at such a depth from the substrate surface as enables the charges to be read completely when a voltage is applied to the gate to read the charges stored in the PD 21. Preferably, it is 0.65 μm or less.

As described above, with the first embodiment, the second n-type diffused layer 21b is provided so as to self-align with the gate electrode 22 on the gate side in the upper part of the first n-type diffused layer 21a formed in a deep place inside the p-type substrate or p-type well 20. Forming the second n-type diffused layer 21b this way eliminates the danger of short-channel effects and enables the formation of a charge path without a potential barrier. This enables the signal charges stored in the PD 21 to be read sufficiently even at a voltage equal to or lower than a power supply voltage of 3.3V used for the CMOS device, improving the sensitivity the sensor and reducing noise.

Figure 9:
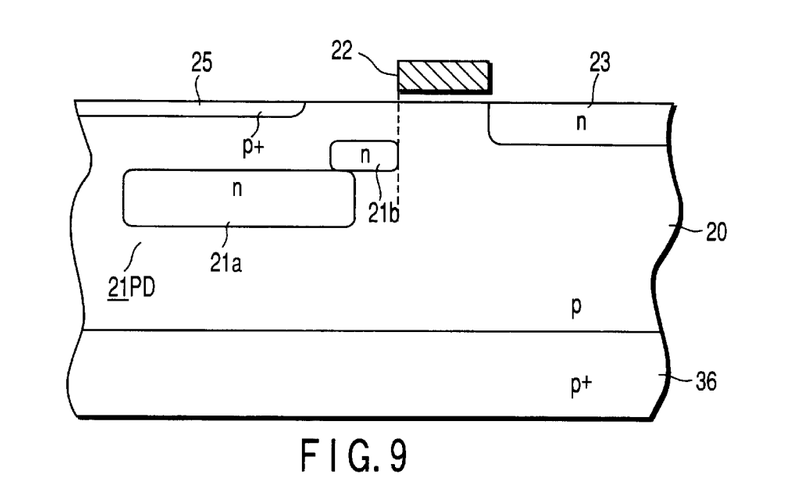
FIG. 9 is a sectional view showing the configuration of another modification of the first embodiment.

The p-type substrate or p-type well 20 in the first embodiment may be replaced with a p-type epitaxial layer 20 provided on a p+-type substrate 36 as shown in FIG. 9.

(Second Embodiment)

Figure 10:
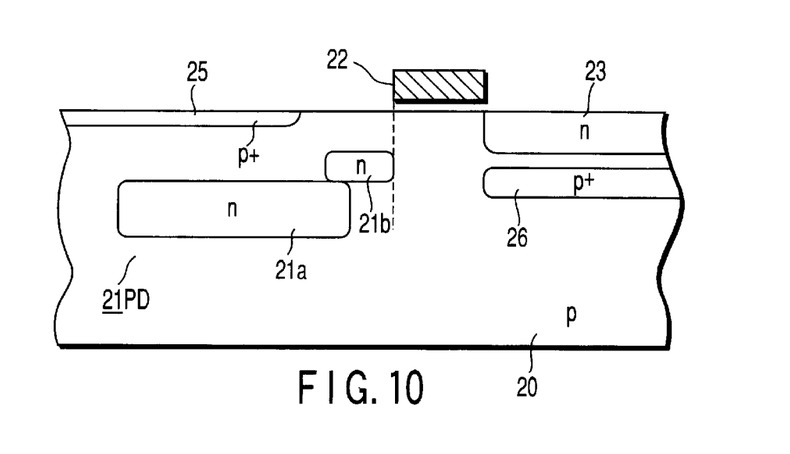
FIG. 10 is a sectional view showing the configuration of an element in a MOS image sensor according to a second embodiment of the present invention.

FIG. 10 is a sectional view showing the configuration of an element in a MOS image sensor according to a second embodiment of the present invention. In FIG. 10, the same parts as those in FIG. 6 are indicated by the same reference symbols and a detailed explanation thereof will not be given.

The basic structure of the image sensor of the second embodiment is the same as that of the first embodiment except that a punch-through stopper composed of a p+-type diffused layer is provided below the drain region 23 to prevent punch through from the PD 21 to the drain region 23.

Figure 11A:
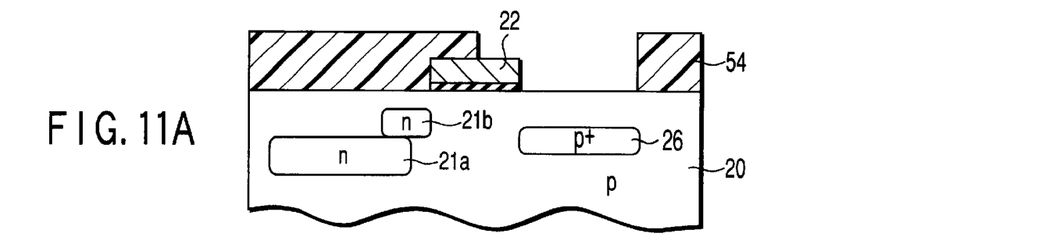
FIGS. 11A to 11C are sectional views to help explain stepwise the process of manufacturing a MOS image sensor in the second embodiment.
Figure 11B:
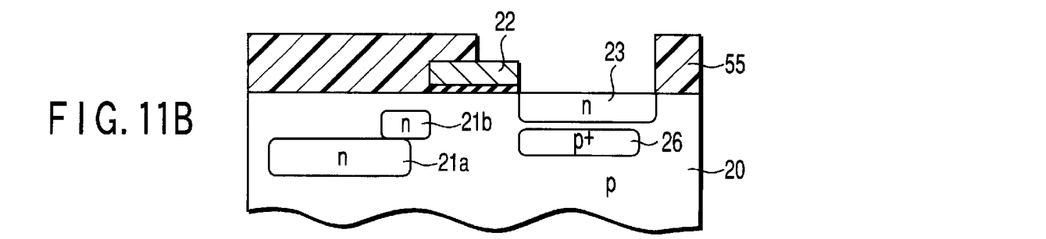
Figure 11C:
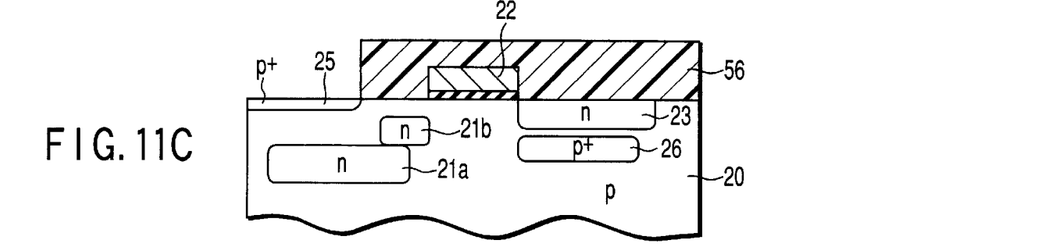

FIGS. 11A to 11C illustrate stepwise a method of manufacturing an image sensor of the second embodiment. The processes from FIGS. 7A to 7C in the first embodiment are first carried out in the second embodiment as well.

Next, as shown in FIG. 11A, after the resist pattern 33 has been removed and a new resist pattern 54 has been formed, the punch-through stopper 26 composed of a p+-type diffused layer is formed so as to self-align with the gate electrode 22.

Then, as shown in FIG. 11B, after the resist pattern 54 has been removed and a new resist pattern 55 has been formed, a drain region 23 made up of an n-type diffused layer is formed by ion implantation in such a manner that the drain region self-aligns with the gate electrode 22. Note that the n-type impurity can be ion-implanted with the resist pattern 54 formerly provided, without forming the new resist pattern 55.

Thereafter, as shown in FIG. 11C, after the resist pattern 55 has been removed and a new resist pattern 56 has been formed, ions are implanted at low acceleration, thereby forming a p+-type diffused layer (surface shield layer) 25 on the PD 21 side of the gate electrode 22.

With the second embodiment, the p+-type punch-through stopper 26 is provided below the n-type drain region 23 in the structure where the p+-type surface shield layer 25 is provided above the n-type diffused layer 21a. Providing the punch-through stopper this way enables the signal charges stored in the PD 21 to be read completely using the MOS transistor operating on a low voltage, without causing punch through even when the impurity concentration in the p-type substrate or p-well 20 is lowered sufficiently.

(Third Embodiment)

Figure 12:
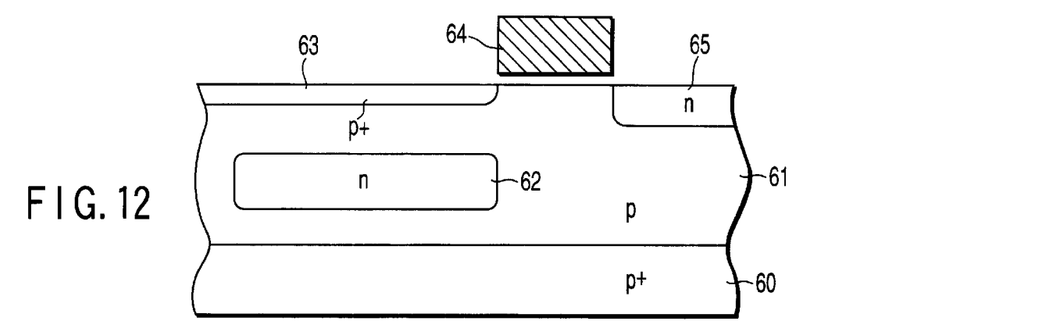
FIG. 12 is a sectional view showing the configuration of an element in a MOS image sensor according to a third embodiment of the present invention.

FIG. 12 is a sectional view showing the configuration of an element in a MOS image sensor according to a third embodiment of the present invention. It particularly shows the configuration of the PD portion and vicinity thereof. In the third embodiment, the optimum relationship between the position at which the impurity concentration in a p-well is the lowest and the position of the PD portion will be explained. A second n-type diffused layer is not provided in the PD portion in the third embodiment, however it may be provided.

In FIG. 12, numeral 60 indicates a p+ region (a region more than 5 μm below the substrate surface) where the B concentration in a p/p+ substrate is higher, 61 an epitaxial layer region in the p/p+ substrate, 62 an n-type diffused layer region of a photodiode PD for causing photoelectric conversion, 63 a p-type diffused layer region (a surface shield layer) for shielding the PD, 64 a gate electrode formed above the substrate in such a manner that it is insulated from the substrate, and 65 a drain region.

Figure 13:
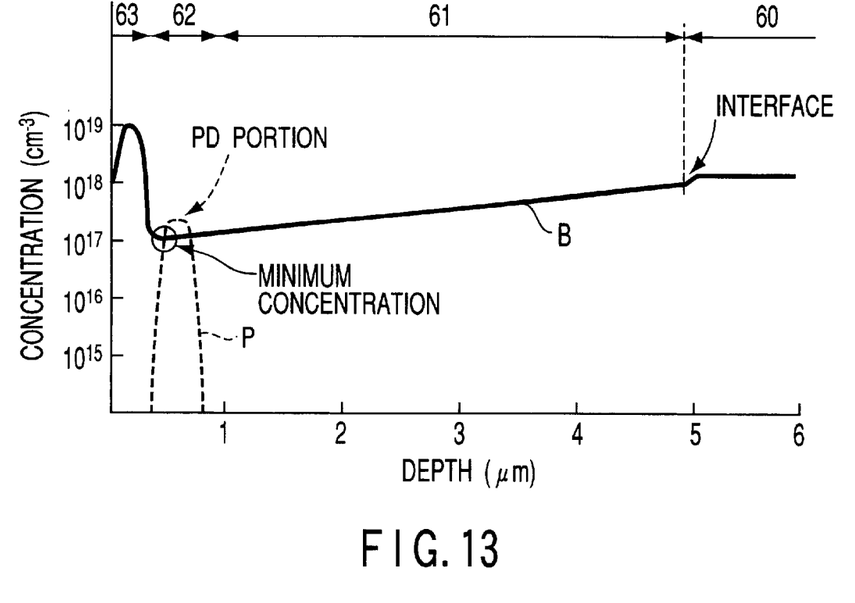
FIG. 13 shows an impurity concentration profile in the direction of depth in the PD portion in the third embodiment.
Figure 14:
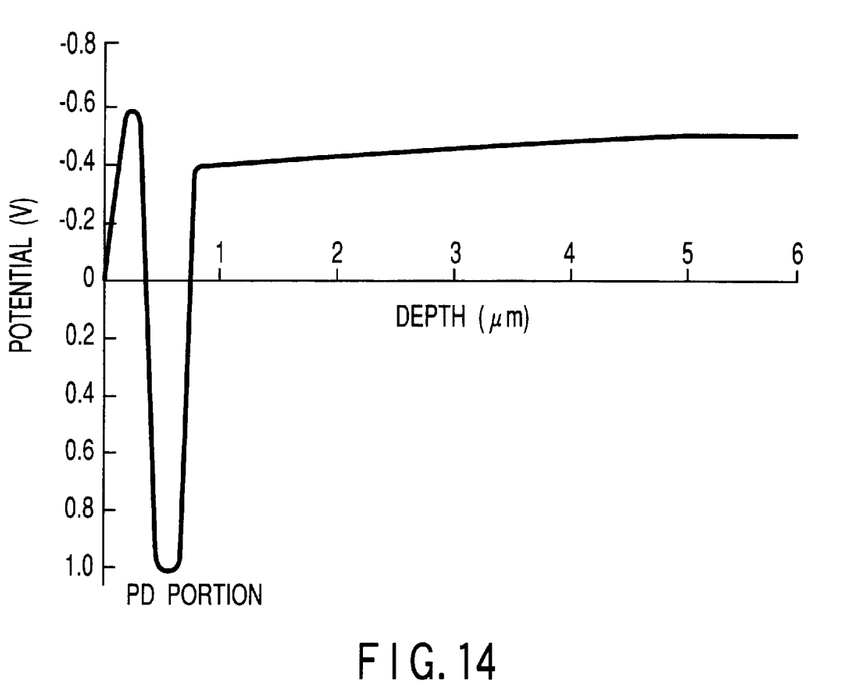
FIG. 14 shows a potential distribution in the direction of depth in the PD portion in the third embodiment.

FIGS. 13 and 14 show an impurity concentration profile (phosphorus and boron) and a potential profile in the direction of depth in the PD portion in the third embodiment. The B concentration becomes higher ($2 \times 10^{18}$ cm$^{-3}$) in the p+ region 60 in a deep place (at a depth of more than about 5 μm) of the substrate. B diffuses from the p+ region substrate to the epitaxial layer 61 formed on the p+ region 60. The impurity concentration in the epitaxial layer 61 varies gently in the range from $1 \times 10^{18}$ to $1 \times 10^{17}$ cm$^{-3}$.

On the other hand, the surface shield layer 63 for shielding the surface is provided in the vicinity of the substrate surface, increasing the B concentration again ($1 \times 10^{19}$ cm$^{-3}$). As a result, a place where the B concentration is the lowest exists in the epitaxial layer 61 in the substrate. P (phosphorus) ions have been implanted to form the n-type diffused region 62 of the photodiode PD. The peak depth of the P concentration is determined mainly by energy of P ion implantation. The positional relationship between the depth at which the B ion concentration is the lowest and the peak concentration depth of the P concentration is such that the depth at which the B ion concentration is the lowest is located closer to the substrate surface side than the peak concentration depth of the P concentration.

The positional relationship between the depth at which the B concentration is the lowest and the concentration depth at which the P concentration is the highest is as shown by the potential profile of FIG. 14, which allows electrons to gather around the surface of the substrate. As a result, the electrons generated by photoelectric conversion do not flow toward a deep place in the substrate once but are gathered swiftly into the n-type diffused region 62. This eliminates the disadvantage that electrons are rebounded at a deep place in the substrate and diffuse sidewise in the substrate. Consequently, the sensitivity of the sensor is improved and color cross talks are reduced. Furthermore, blooming is suppressed.

A method of forming the impurity profile of FIG. 13 will be explained in further detail. Explanation will center round a method of forming the photodiode portion featuring the present invention.

A p/p+ substrate is used to form a MOS image sensor according to the third embodiment. At this time, the B concentration in a deep place 60 in the substrate is $2 \times 10^{18}$ cm$^{-3}$. The epitaxial layer 61 has been grown on the substrate surface. The thickness of the epitaxial film is, for example, 5 μm and the B concentration in the epitaxial layer 61 is $2 \times 10^{15}$ cm-$^{3}$. Normally, because the epitaxial layer 61 is grown at a rate of 1 μm/minute, B hardly diffuses from the p+ region 60 to the surface of the epitaxial layer 61. Therefore, at this stage, a sharp B concentration profile is kept near the interface between the epitaxial layer 61 and substrate 60.

To diffuse B to the substrate surface using the p/p+ substrate, B present in the region shown by 60 is diffused thermally at, for example, about 1190° C. for about three hours. As a result, a p-well is formed which has a B concentration of about $1\times10^{17}$ cm$^{-3}$ near the surface of the substrate. This enables the formation of a B concentration profile where the B concentration is the lowest near the substrate surface.

Using the p/p$^+$ substrate with the above B concentration profile, to form the n-type layer 62 of the photoelectric conversion section PD, a resist is applied, patterning is done, and P ions are implanted. At this time, for example, P ions are implanted at an acceleration voltage of 200 KeV with a dose of $1.5\times10^{13}$ cm$^{-3}$. This forms a P concentration profile where the P concentration peak is about 0.6 μm below the substrate surface. When the depth at which the impurity concentration in the n-type layer 62 of the photoelectric conversion section PD is the highest is 0.65 μm or less, the charges stored in the photoelectric conversion section PD 21 can be transferred completely.

Next, the surface state of the PD is shielded with B to form the PD with an S3 structure (Surface Shield Sensor), thereby forming a p-type layer for the PD at the surface. Specifically, after a resist has been applied and patterning has been done, for example, B ions are implanted at 35 KeV with a dose of $1\times10^{14}$ cm$^{-2}$, thereby forming a p$^+$-type layer 25 as a surface shield. As a result, the n-type diffused layer 62 of the PD for photoelectric conversion is embedded in the substrate, thereby forming a S3-structure PD with the substrate surface shielded by B. The ordinary processes are applied for the formation of gate electrodes, sources and drains, etc of other transistors and capacitors.

With the above method, the B and P concentration profile in the direction of depth of the PD portion is made into the impurity profile as shown in FIG. 13.

(Fourth Embodiment)

Figure 15:
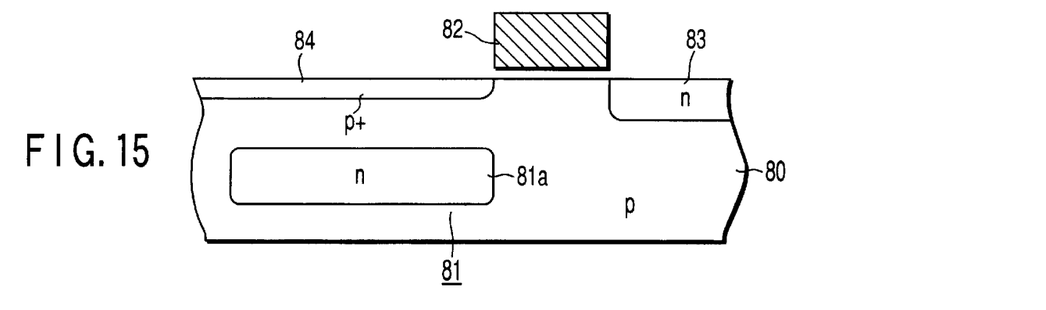
FIG. 15 is a sectional view showing the configuration of an element in a MOS image sensor according to a fourth embodiment of the present invention.

FIG. 15 is a sectional view showing the configuration of an element in a MOS image sensor according to a fourth embodiment of the present invention. It particularly shows the configuration of the PD portion and the vicinity thereof. In the fourth embodiment, a favorable combination of the impurity concentration in the n-type diffused layer of a PD and the impurity concentration in a p-type substrate or a p-type well will be explained.

In FIG. 15, the n-type diffused layer 81a of a photodiode (PD) 81 for converting light into charge is formed in a specific position below the surface of a p-type well 80. At the surface of the p-well 80, a surface shield layer 84 made of a high concentration p+ diffused layer is formed above the n-type diffused layer 81a and the drain region 83 of a read transistor is formed in such a manner that it is spaced a specific distance apart from the surface shield layer 84. In addition, a gate electrode 82 for reading the charges stored in the n-type diffused layer 81a of the PD into the drain region 83 is provided above the surface of the p-well 80.

The process of manufacturing the MOS image sensor is basically the same as that explained in the first embodiment. Specifically, after the gate electrode 82 made of a polysilicon film has been formed at the surface of the p-well 80, the n-type diffused layer 81a constituting the PD 81 is formed at a specific depth from the surface of the p-well 80. Then, the surface shield layer 84 is formed above the n-type diffused layer 81a and the n-type diffused layer 83 is formed as the drain region on the opposite side of the gate electrode 82 to the n-type diffused layer 81a. The surface shield layer 84 is not necessarily needed and may be eliminated.

With the above structure and method, a plurality of specimens were produced changing the dope of boron (B) as a p-type impurity and the dope of phosphorus (P) as an n-type impurity. At that time, when the n-type diffused layer 81a of the PD 81 was formed, phosphorus ions with a valence of 1 were implanted at an acceleration voltage ranging from 100 KeV to 1000 KeV. In addition, when the p-type diffused layer 85 was formed as a surface shield layer, boron ions were implanted at a suitable acceleration voltage in the range from 10 KeV to 300 KeV.

Figure 16:
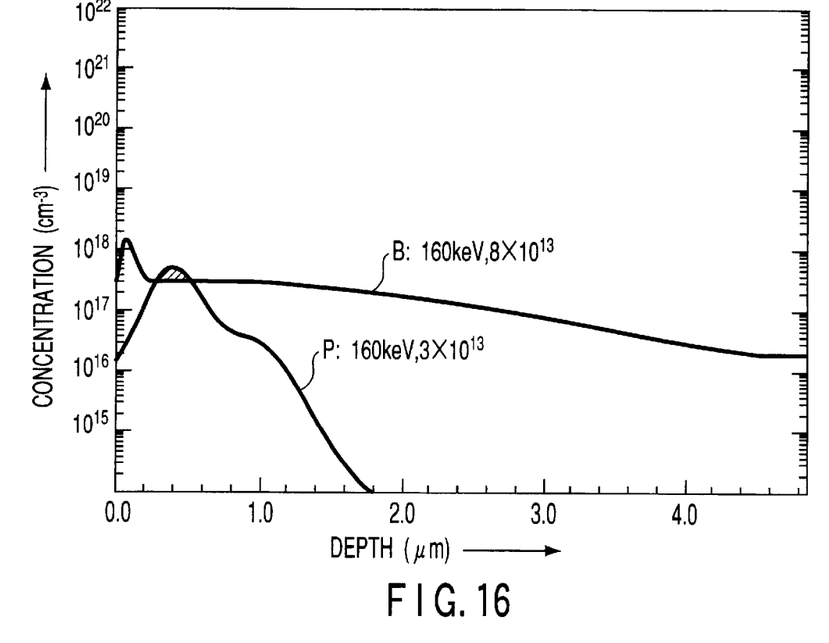
FIG. 16 shows an example of a concentration distribution in the direction of depth of the PD portion in a specimen formed in the fourth embodiment.
Figure 17:
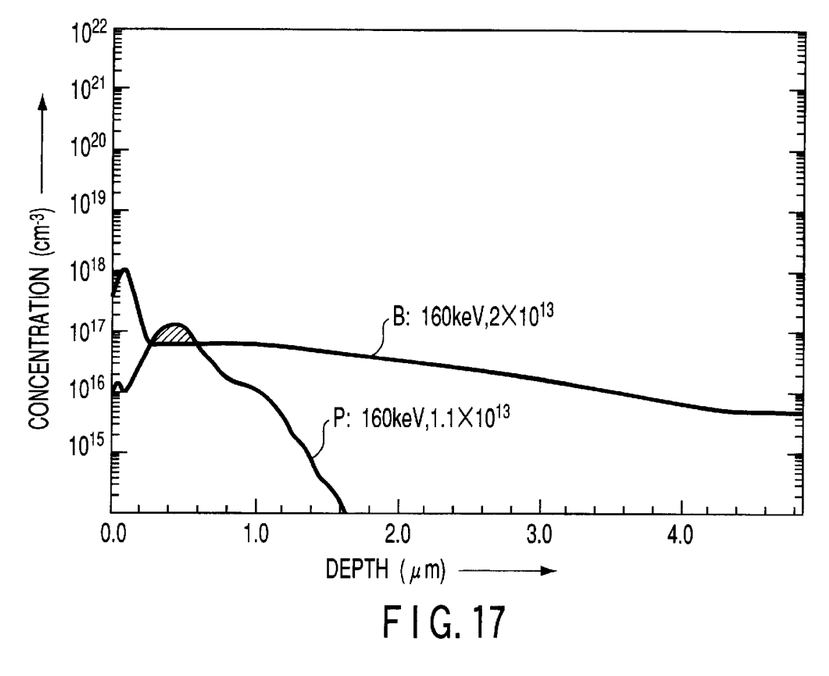
FIG. 17 shows an example of a concentration distribution in the direction of depth of the PD portion in another specimen formed in the fourth embodiment.
Figure 18:
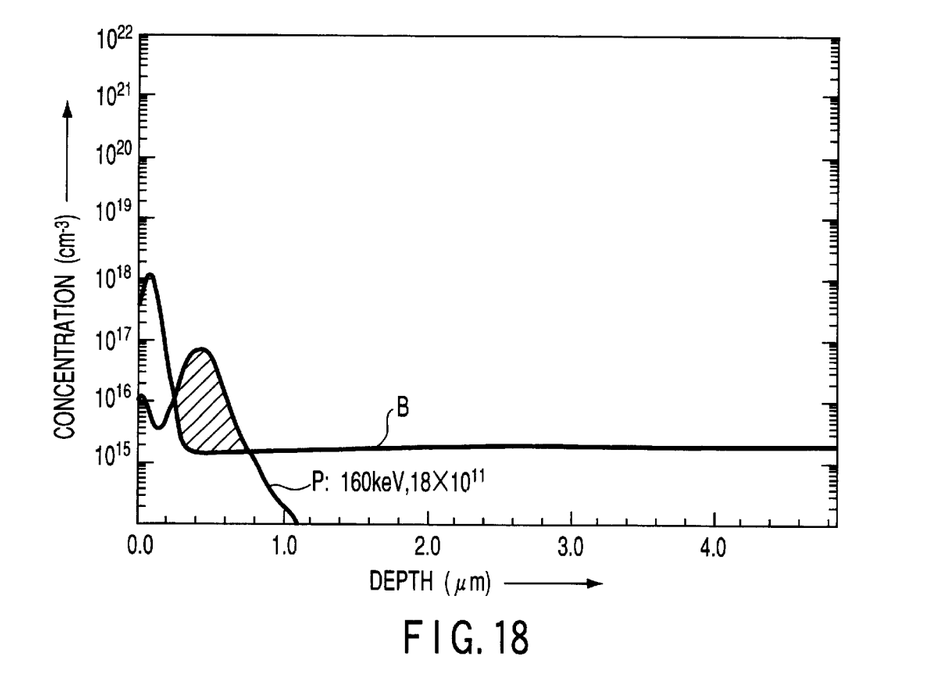
FIG. 18 shows an example of a concentration distribution in the direction of depth of the PD portion in still another specimen formed in the fourth embodiment.

Of these specimens, the one whose PD portion turned into a complete depletion layer by low-voltage driving (at 3.3V) was selected. FIGS. 16 to 18 show examples of a concentration distribution in the direction of depth of the PD portion in the selected specimen.

In FIG. 16, the B concentration in the part corresponding to the p-type well 80 of FIG. 15 is $3.0\times10^{17}$ cm$^{-3}$, the P concentration in the part corresponding to the n-type diffused layer 81a is $4.0\times10^{17}$ cm$^{-3}$, and the B concentration in the part corresponding to the surface shield layer 84 is $1.0\times10^{18}$ cm$^{-3}$. It is in the hatched area in FIG. 16 where the P concentration is higher than the B concentration that the PD 81 part turns into a complete depletion layer.

In FIG. 17, the B concentration in the part corresponding to the p-type well 80 of FIG. 15 is $9.0\times10^{16}$ cm$^{-3}$, the P concentration in the part corresponding to the n-type diffused layer 81a is $1.3\times10^{17}$ cm$^{-3}$, and the B concentration in the part corresponding to the surface shield layer 84 is $1.0\times10^{18}$ cm$^{-3}$. It is in the hatched area in FIG. 17 where the P concentration is higher than the B concentration that the PD 81 part turns into a complete depletion layer.

In FIG. 18, the B concentration in the part corresponding to the p-type well 80 of FIG. 15 is $2.0\times10^{15}$ cm$^{-3}$, the P concentration in the part corresponding to the n-type diffused layer 81a is $7.0\times10^{16}$ cm$^{-3}$, and the B concentration in the part corresponding to the surface shield layer 84 is $1.0\times10^{18}$ cm$^{-3}$. It is in the hatched area in FIG. 18 where the P concentration is higher than the B concentration that the PD 81 part turns into a complete depletion layer.

Figure 19:
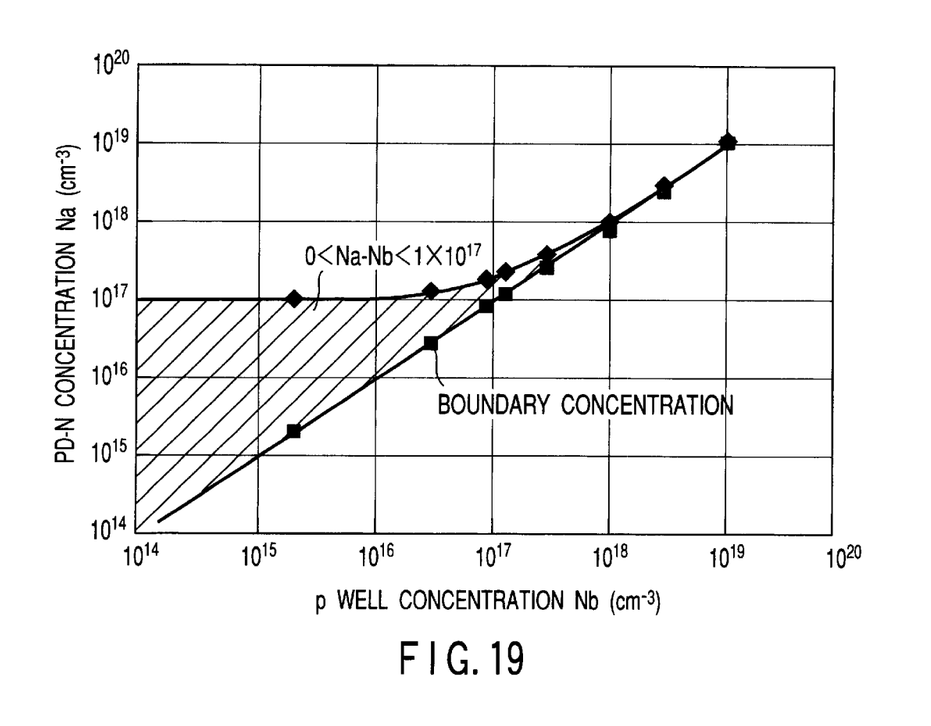
FIG. 19 is a diagram to help explain the relationship between the optimum concentration in the PD region and the impurity concentration in the well obtained in FIGS. 16 to 18.

FIG. 19 presents a graph including the above results, which shows a correlation between the concentration in the p-well 80 and that in the PD 81 in FIG. 15. Although the concentration in the PD 81 at which the PD part turns into a complete depletion layer varies with the concentration in the p-well 80, the PD81 part turns into a complete depletion layer in the hatched area of FIG. 19, which realizes a noise-free MOS image sensor. In the hatched region, the relationship of the p-type impurity B concentration Nb in the p-well 80 with the n-type impurity P concentration Na in the PD 81 satisfies the expression $0<Na-Nb<1.0\times10^{17}$ cm$^{-3}$. In the range, the above effect was achieved.

As described above, with the fourth embodiment, the relationship between the P concentration Na in the PD 81 and the B concentration Nb in the p-well 80 is optimized, thereby eliminating kTC noise caused by a virtual capacitance in the PD portion and improving the picture quality.

With the fourth embodiment, too, when the depth at which the impurity concentration in the n-type layer 81a of the photoelectric conversion section PD is the highest is 0.65 μm or less, the charges stored in the photoelectric conversion section PD 81 can be transferred completely.

In the fourth embodiment, the effect of the present invention will be obtained in the case where the surface shield layer 84 is not provided, or provided apart from the gate electrode as well.

While in the above embodiments, explanation has been given using a MOS image sensor as an example, the present invention may be applied to a CCD image sensor, provided that it is based on a system that causes a read transistor to read signal charges from a photoelectric conversion section, such as a photodiode. In addition, while in the above embodiments, the photoelectric conversion section also acts as the signal storage section, the photoelectric conversion section may be provided separately from the signal storage section.

Furthermore, while in the embodiments, explanation has been given on the assumption that the first conductivity type is p and the second conductivity type is n, the present invention may be applied to a case where these conductivity types are reversed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image sensor comprising:

a first-conductivity-type semiconductor layer with a surface;

a second-conductivity-type first region provided in said semiconductor layer, constituting a photo-electric conversion section together with said semiconductor layer to store photoelectrically converted signal charges, and having a first end and a second end opposite to each other in one direction along said surface of said semiconductor layer;

a gate electrode insulatively provided above said surface of said semiconductor layer so as to be adjacent to said second end of said first region, having a first end and second end opposite to each other in said one direction along said surface of said semiconductor layer, said first end of said gate electrode being offset from a line perpendicular to said surface of said semiconductor layer and passing through said second end of said first region, and positioned on said surface of said semiconductor layer in a part other than that above said first region;

a second-conductivity-type second region provided on an upper part of said first region so as to be in contact with said first region, having a first end and a second end opposite to each other in said one direction along said surface of said semiconductor layer; and a second-conductivity-type third region adjacent to said second end of said gate electrode, provided on said surface of said semiconductor layer opposite to said first region, and serving as a drain region.

2. The solid-state image sensor according to claim 1, wherein said second end of said first region is displaced from said second end of said second region toward said first end of said second region.

3. The solid-state image sensor according to claim 1, further comprising a first-conductivity-type fourth region provided on said surface of said semiconductor layer above said first region and serving as a surface shield region whose impurity concentration is higher than that in said semiconductor layer.

4. The solid-state image sensor according to claim 1, further comprising a first-conductivity-type fifth region provided under said third region and serving as a punch through stopper whose impurity concentration is higher than that in said semiconductor layer.

5. The solid-state image sensor according to claim 1, wherein a depth at which said second-conductivity-type impurity concentration is the highest throughout said first region and said second region is 0.65 μm or less below said surface of said semiconductor layer.

6. The solid-state image sensor according to claim 1, wherein said semiconductor layer is a semiconductor substrate.

7. The solid-state image sensor according to claim 1, wherein said semiconductor layer is a well provided on a semiconductor substrate.

8. The solid-state image sensor according to claim 1, wherein said semiconductor layer is an epitaxial layer formed on a semiconductor substrate whose impurity concentration is higher than that in said semiconductor layer.

9. The solid-state image sensor according to claim 1, wherein said second end of said second region is substantially aligned with said first end of said gate electrode in a direction perpendicular to said surface of said semiconductor layer.

10. The solid-state image sensor according to claim 1, wherein an impurity concentration Na in said second-conductivity-type second region is set so that a relationship with an impurity concentration Nb in said first-conductivity-type semiconductor layer satisfies a following expression:

$$0 < Na - Nb < 1 \times 10^{17} \text{ cm}^{-3}.$$

11. A solid-state image sensor comprising:

a p-type semiconductor substrate having a surface;

a p-type well provided on said surface of said semiconductor substrate, an impurity concentration of said p-type well being lower than a p-type impurity concentration in a place of said semiconductor substrate deeper than said p-type well; and an n-type region provided in said p-type well and, together with said p-type well, forming a photoelectric conversion section, wherein a depth at which an n-type impurity concentration in said n-type region is the highest is deeper than a depth at which a p-type impurity concentration in a depth direction of said substrate is the lowest throughout said p-type well and said substrate.

12. The solid-state image sensor according to claim 11, wherein a p-type surface shield layer whose impurity concentration is higher than that in said p-type well is formed above said n-type region.

13. The solid-state image sensor according to claim 11, wherein said depth at which said n-type impurity concentration in said n-type region is the highest is 0.65 μum or less below said surface of said semiconductor substrate.

14. A solid-state image sensor comprising:

a semiconductor substrate of a first conductivity; and an imaging region formed in said semiconductor substrate and having unit cells arranged in a matrix, each of said unit cells including a photoelectric conversion section composed of a second conductivity-type region formed in said semiconductor substrate and a first conductivity-type region made up of said semiconductor substrate, and a signal scanning circuit, wherein an impurity concentration Na in said second conductivity-type region constituting said photoelectric conversion section is set so that a relationship with an impurity concentration Nb in said first conductivity-type region constituting said photoelectric conversion section satisfies a following expression:

$0 < Na-Nb < 1\times10^{17}$ cm$^{-3}$.

15. The solid-state image sensor according to claim 14, wherein a first conductivity-type surface shield layer whose impurity concentration is higher than that in said semiconductor substrate is formed above said second conductivity-type region.

16. The solid-state image sensor according to claim 14, wherein a depth at which said impurity concentration in said second conductivity-type region is the highest is 0.65 μm or less below a surface of said semiconductor substrate.

17. The solid-state image sensor according to claim 14, wherein said impurity concentration Na in said second conductivity-type region constituting said photoelectric conversion section is in a range of $1\times10^{14}$ cm$^{-3}$ to $1\times10^{18}$ cm$^{-3}$.

18. The solid-state image sensor according to claim 14, wherein said impurity concentration Nb in said first conductivity-type region below said photoelectric conversion section is in a range of $1\times10^{14}$ cm$^{-3}$ to $1\times10^{18}$ cm$^{-3}$.

19. A solid-state image sensor comprising:

a first conductivity-type semiconductor layer with a surface;

a second-conductivity-type first region provided in said semiconductor layer, constituting a photo-electric conversion section together with said semiconductor layer to store photoelectrically converted signal charges, and having a first end and a second end opposite each other in one direction along said surface of said semiconductor layer;

a gate electrode insulatively provided above said surface of said semiconductor layer so as to be adjacent to said second end of said first region, having a first end and a second end opposite to each other in said one direction along said surface of said semiconductor layer, said first end of said gate electrode being offset from a line perpendicular to said surface of said semiconductor layer and passing through said second end of said first region;

a second-conductivity-type second region provided on an upper part of said first region so as to be in contact with said first region, having a first end and a second end opposite to each other in said one direction along said surface of said semiconductor layer; and a second-conductivity-type third region adjacent to said second end of said gate electrode, provided on said surface of said semiconductor layer opposite to said first region, and serving as a drain region.

20. The solid-state image sensor according to claim 19, wherein said second end of said second region is substantially aligned with said first end of said gate electrode in a direction perpendicular to said surface of said semiconductor layer.

* * * * *

UNITED STATES PATENT AND TRADEMARK OFFICE
CERTIFICATE OF CORRECTION

PATENT NO.     : 6,521,925 B1
DATED          : February 18, 2003
INVENTOR(S)    : Mori et al.

It is certified that error appears in the above-identified patent and that said Letters Patent is hereby corrected as shown below:

Column 14,
Line 50, change "0.65 μum" to -- 0.65 μm --.

Signed and Sealed this

Fifteenth Day of April, 2003

JAMES E. ROGAN
*Director of the United States Patent and Trademark Office*